Figure 1:
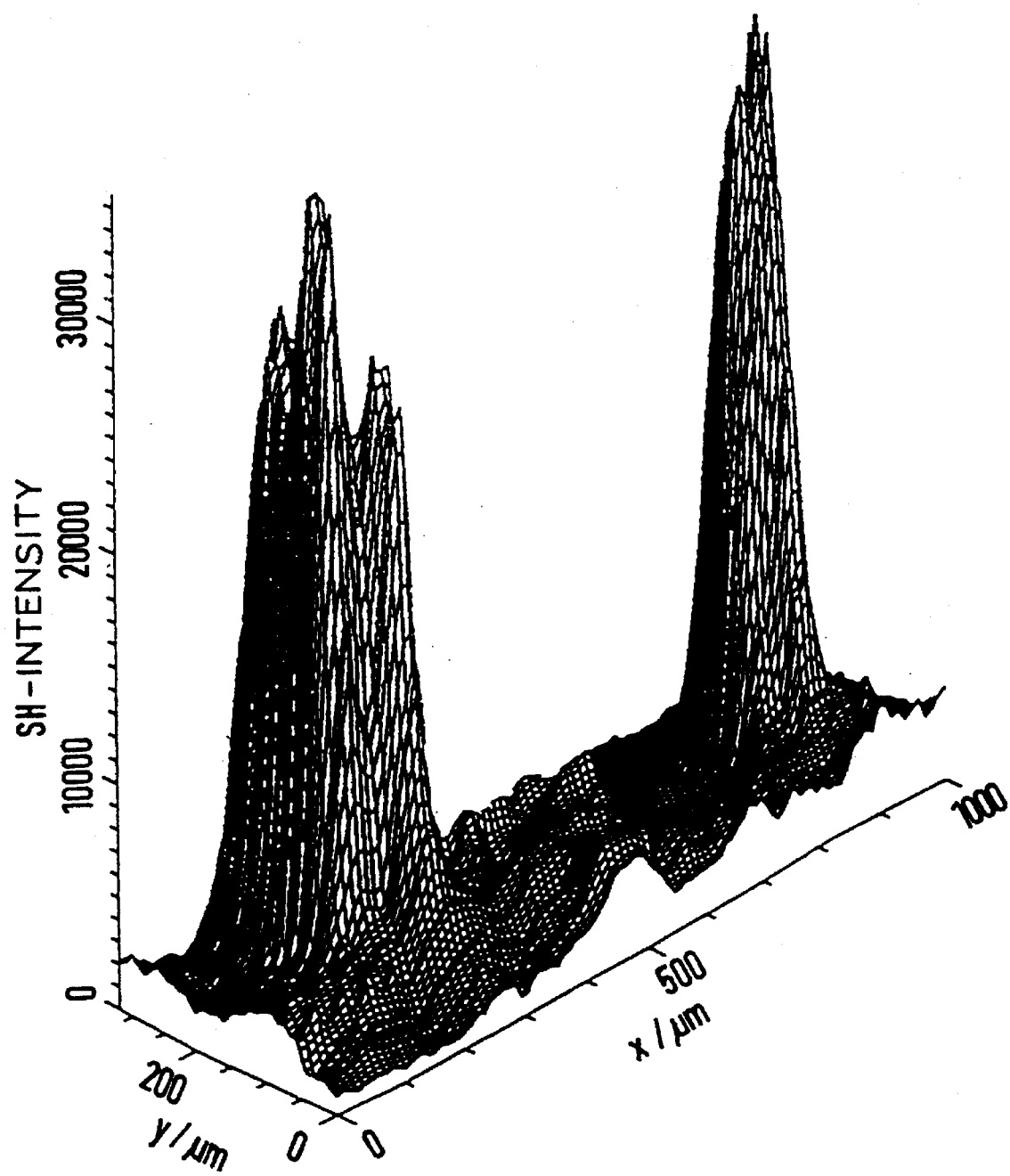

United States Patent [19]
Danz et al.

[11] Patent Number: 5,637,370
[45] Date of Patent: Jun. 10, 1997

[54] INFORMATION STORAGE DEVICE

[75] Inventors: Rudi Danz, Kleinmachnow; Andreas Büchtemann, Potsdam; Manfred Pinnow; Armin Wedel, both of Teltow, all of Germany

[73] Assignee: Fraunhofer-Gesellschaft Zur Forderung Der Angewandten, Munich, Germany

[21] Appl. No.: 406,379

[22] Filed: Mar. 17, 1995

[30] Foreign Application Priority Data

Mar. 22, 1994 [DE] Germany .......................... 44 09 850.2

[51] Int. Cl.$^6$ ................................................. B32B 7/00
[52] U.S. Cl. ............... 428/64.1; 428/64.2; 428/64.4; 428/64.7; 428/446; 428/447; 428/915; 430/270.14; 430/495.1; 430/945; 369/283; 369/288
[58] Field of Search ..................... 428/64.1, 64.2, 428/64.4, 64.5, 64.7, 446, 457, 913; 430/270, 495, 945, 270.1, 270.11, 270.14, 495.1; 369/275.1, 275.5, 283, 288

[56] References Cited

U.S. PATENT DOCUMENTS 4,059,827  11/1977  Byatt ..................................... 365/126
4,800,526  1/1989  Lewis .................................... 365/118
5,418,029  5/1995  Yamamoto ............................ 428/64.1

FOREIGN PATENT DOCUMENTS 3125776  5/1982  Germany .

*Primary Examiner*—Patrick Ryan
*Assistant Examiner*—Elizabeth Evans
*Attorney, Agent, or Firm*—Marshall & Melhorn

[57] ABSTRACT

Information storage unit comprising a substrate with applied thereon a polymer layer (active polymer layer) which is polarisable by a focussed electron beam, the active polymer layer being a component of a multilayer, said multilayer comprising an active polymer layer of at least one to a maximum of fifteen electrically-insulating layers and at least one to a maximum of fifteen electrically conductive and/or semiconductive layers in an optional layer sequence, on condition that the active layer is disposed between at least one electrically-insulating layer and at least one conductive or semiconductive layer.

6 Claims, 1 Drawing Sheet

INFORMATION STORAGE DEVICE

The invention relates to an information storage unit comprising a substrate with applied thereon a polymer layer (active polymer layer) which is polarisable by a focussed electron beam, the active polymer layer being a component of a multilayer.

Methods are known of inscribing information at extremely high information density into thin metal or semiconductor layers with a focussed and accelerated electron beam. By making use of the apparatus systems developed for electron beam lithography, it is possible to produce nanometre structures with line widths smaller than 10 nm. It is known from C. Morgan, G. S. Chen, C. Boothroyd, S. Bailey, C. Humphreys, Physics World, Nov. 1992, pages 28–32, to burn holes with a thickness of 5 nm into thin aluminium layers, or to generate nanometre structures (quantum dots) in thin silicon layers. These possible information storage systems have the distinct disadvantage that they are not based upon reversible processes. They cannot be deleted, and information readout has not until now been satisfactorily resolved. From D. Schilling, S. Schuler, K. Dransfeld, Proc. 6th Internat. Symposium on Electrets (ISE 6), Oxford 1988, pages 80–86, it is known to undertake information storage with a focussed electron beam, polymer layers applied on a substrate being used. In this case thin fluoric polymer layers serving as active layers on substrates are irradiated with a focussed electron beam, and the irradiated regions are detected by contrast examination. In this respect polyvinylidene fluorides (PVDF) and vinylidene fluoride/trifluorethylene-copolymers (VDF-TrFE) are used as thin active polymer layers.

A disadvantage in all these processes, however, is that with the layers used and under the conditions indicated, damage is caused to the polymer structure by the electron irradiation. Thus reversibility is rendered impossible. Furthermore, after electron irradiation, no electrical potential could be measured on these layers, so that the structuring processes necessary for information storage could not take place. These publications also lack any proof of these molecular processes, and no possibility of readout could be detected. These systems, known until the present from prior art, are therefore unsuitable for molecular, reversible information storage.

Proceeding from this prior art, the purpose of the present invention is to indicate an information storage unit which permits molecular and reversible information storage.

This purpose is fulfilled according to the invention by the characterising features of claim 1, or by the characterising features of claim 3. The secondary claims illustrate advantageous further developments.

The above, as well as other advantages of the present invention, will become readily apparent to those skilled in the art from the following detailed description of a preferred embodiment when considered in the light of the accompanying drawing in which:

FIG. 1 is an illustration of an information readout with an optical signal in accordance with Example 1.

Thus it is proposed according to the invention to apply a so-called multilayer to the substrate. The multilayer system according to the invention is so constructed that the active layer is disposed between at least one electrically-insulating layer and at least one conductive and/or semiconductive layer. The molecular structure and arrangement of this active polymer layer is now controlled by electrical fields. This is possible because of the arrangement described above. By virtue of the fact that the active polymer layer is now disposed between an electrically-insulating and an electrically-semiconductive and/or electrically-conductive layer, electrical fields are built up by means of which the dipoles in the active polymer layer can be rotated. The electrically controllable active polymer layer accordingly serves as a molecular information storage layer, while the other layers in the multilayer system fulfil readout functions, and participate in specific alternative effects with the impinging focussing electron beams which are necessary for initiating the field-induced molecular structuring processes in the information storage layer, and thus for optimum molecular information storage.

Another way of providing a solution (claim 3) is founded on the same basic principle. According to this, however, a an electrically-conductive or semiconductive substrate is used. In this case the multilayer system can be so constructed that the electrical field is built up between the substrate, which as such is in fact conductive or semiconductive, and an adjoining electrically-insulating layer above the active polymer layer.

The combination of the active polymer layer with a p- or n- semiconductor has the advantage that the electrical polarisation in the polymer/semiconductor interface, induced by the focussed electron beam, selectively alters the electronic band structure, so that in this way a piece of information is written in which can again be read out with high resolution with an electron beam.

It is of particular advantage with the information storage unit according to the invention that the structured information generated in the multilayers is thermally stable up to at least 130° C., and thus is not volatile. The applicant was further able to show that, by means of electrical or heat pulses, the stored information could be deleted and thereafter written in again any number of times. Because of the molecular character of the information stored, and of the capacity of focusing electron beams, structures in the nanometre range of less than 100 nm are possible, and thus storage densities exceeding those of CD ROMs by about 2 orders of magnitude. Readout may be effected by optical techniques and/or electrically, such for example as by electron radiation. Furthermore, the multilayers according to the invention may also be read out piezoelectrically and pyroelectrically. In this case they are utilisable not only as information storage, but also as sensor arrays. The multilayers are insensitive to electrical and magnetic fields.

In this respect it is particularly preferred, in the variant according to Patent claim 1, to provide on the substrate side at least one conductive and/or semiconductive layer. By this means the electron beam can now enter into the electrically-insulating layer located over the active layer and, with the electrically-conductive or semiconductive layer, which is earthed during polarisation, an electrical field may be built up. It is basically however also possible for the electrically-insulating layer to be applied on the substrate side, and for the electrically-conductive or semiconductive layer, which is likewise earthed, to be applied above the active polymer layer, i.e. towards the irradiated side. In this case the electron beam is controlled in such a way that it penetrates as far as the electrically-insulating layer and is there stored, so that an electrical field may again be built up.

The layer thickness of the individual layers of the multilayer in this case preferably lies in the range between 1 mm and 1 mm. It is quite specifically preferred that the layer thicknesses of the active polymer layer should lie in the range between 10 nm and 3000 nm, those of the electrically-insulating layer between 5 nm and 3000 nm, those of the electrically-semiconductive layer between 5 nm and 1 mm, and those of the conductors between 1 nm and 100 nm.

The active polymer layer (information storage layer) in this case preferably comprises special fluoric polymers. Examples of fluoric polymers are vinylidene fluoride($VF_2$), trifluorethylene ($F_3E$) or copolymers thereof. Particularly preferred are copolymers of vinylidene fluoride/ trifluorethylene and vinylidene fluoride/tetrafluorethylene. In these copolymers, the molar proportions of the vinylidene fluoride preferably lie between 40 and 100 Mol %. A further preferred variant proposes that the active polymer layer should comprise a mixture of the abovementioned fluoric polymers with polymers, miscible with fluoric polymers, of polyacrylates, polycarbonates or polystyrol. When there are present mixtures of the abovementioned copolymers with the abovementioned polymers, it is advantageous if the copolymer is used in a mixture, e.g. with polymethylmethacrylate in a weight ratio of 50 to 50 up to 99 to 1. In addition to the possible use of fluoric polymers or their copolymers, or their mixtures with polymers, it is also possible to use as an active polymer layer "backbone" polymers which contain hyperpolarisable side groups. Examples of backbone polymers are:
polyacrylate, polyester, polyimide, polysiloxane, polyethylene, polyvinyl ether, polystyrene, polyvinyl alcohol and polycarbonate. Examples of side groups coupled to these polymers are groups containing nitro-, cyano- or amino groups. Special examples of this are: Nitrostilbene, azobenzene, thiophene, cyanobiphenyle, cyanophenylbenzoate, aniline, nitroaniline, aminonitrostilbene, dicyanovinylazo dyestuffs. As insulating layers there are used in particular thin polymer layers on the basis of polystyrol and its copolymers, such for example as:

Styrene-acrylnitrile-copolymer, styrene acrylic acid copolymer, poly(styrol-co-methylmethylacrylate), polyimides, polyisobutylene, polyoxadiazole, potychlorotrifluorethylene, polymers acryl and methacryl bonds, polyurethane, polyethylenterephthalate, polypropylene, polymers with amide bonds, polyisoprene, polyesterurethane, polyvinyl alcohol, esters of polyvinyl alcohol such as polyvinylacetate, polyvinylpropionate, polyvinylbutyrate, polyvinylbenzoate and their copolymers, polyvinylcarbazol, poly (ethylene-co-vinylacetate), polycarbonates and their copolymers such as polybisphenol-A-carbonate, ethylene-vinylacetate-copolymer, NLO polymers, polysilanes, aromatic polysulfone ethers, cellulose derivatives such as cellulose acetate, cellulose propionate, cellulose butyrate, cellulose acetate propionate, cellulose acetate butyrate, cellulose nitrate, polysiloxanes, polyvinylbutyrates, epoxy resins or also $SiO_2$, SiN, SiO, metallic oxides or inorganic glasses.

The following may be used as an electrically-semiconductive layer: P- and/or n-doped semiconductors on the basis of silicon, germanium, gallium arsenide or further semiconductors such for example as indium-tin oxide or indium oxide. The following are particularly considered as electrically-conductive layers: gold, aluminium, silver, platinum, titanium or copper.

The polymer layers are manufactured by spin-coating techniques or film-lifting processes from polymer solutions on the corresponding substrates. The necessary layer thicknesses are in this case adjusted by the concentration of the solutions and/or by the centrifuge or film-lifting conditions. The metallic layers are either evaporated on or sputtered on.

The invention will now be explained in more detail with reference to 9 embodiments given by way of example:

1. In order to manufacture the multilayers there is firstly produced, on a gold-evaporated glass substrate (thickness of the gold layer 30 nm; thickness of glass layer 2 mm), a thin layer of a $VF_2/F_3E$ copolymer (75 Mol % proportion of vinylidene fluoride) in an 80/20 composite with PMMA by spin-coating. The spin conditions and the concentration of the solution are so selected that a layer thickness of 900 nm results. after tempering the layer at 80° C., a polystyrene layer 1 μm thick is likewise applied by spin-coating, from a xylol solution; this is then likewise tempered in vacuo at 80° C. In order to write in the structured information, the multilayer produced is placed in a scanning electron microscope and irradiated with electrons according to the following parameters: Acceleration voltage 5 kV, beam current 100 nA, irradiation time 20 s. The information is written in via masks with PC guidance of the beam current. The information density is adjusted in accordance with the enlargement selected on the scanning electron microscope. An example of an information readout with an optical signal is shown in FIG. 1. The effectiveness of the information storage by the electron irradiation was also proved by detection of an electrical potential of −500 V on the irradiated surface.

2. The multilayers are manufactured by spinning a thin layer of a $VF_2/F_3E$ copolymer (80 Mol % vinylidene fluoride) on to a semiconducting transparent electrode (indium-tin oxide, ITO) on a glass plate. The spinning conditions and the concentration of the polymer solution are so selected that a layer thickness of 2000 nm results. After tempering at +80° C. in vacuo, a temperature-resistant polyimide layer with a thickness of 3000 nm made from an n-methyl-pyromidon solution is spun on to this active polymer layer, and tempered in vacuo. Thereafter a gold layer (30 nm is sputtered on to the polyimide layer. Inscription of the structure information is effected with the aid of an electron beam, the ground (ITO) and cover (gold) electrodes being earthed. In this layer arrangement the acceleration voltage of the electrons is chosen at 10 kv. The charge density introduced comes to 2 μc/cm² during information storage.

3. Manufacture is effected, as described in Example 2, except that the polyimide layer is applied directly to the ITO electrode and thereafter the active polymer layer (as above) and the Au sputtered layer are applied. In this case the acceleration voltage of the electrons is 20 kV. With the ITO and Au electrodes again earthed, the structure information is stored in the information layer by the electron irradiation.

4. Manufacture of the multilayers is effected by spinning a thin layer of a vinylidene fluoride/tetrafluorethylene copolymer (70% vinylidene fluoride) on to a conductive platinum electrode on a glass plate. The spinning conditions and concentration of the polymer solution are so selected that a layer thickness of 50 nm results. After tempering at +80° C. in vacuo, a layer of low-solubility but high-ohmic polymer (e.g. polyethylene or polytetrafluorethylene) is secured by an insulating adhesive to this active polymer layer. Electron irradiation is effected at acceleration voltages of 3 to 20 kV. Deletion of the information is effected by tempering the layer system at above 160° C.

5. Manufacture of the multilayers is effected by spinning a thin layer of a $VF_2/F_3E$ copolymer on to a semiconductive transparent electrode (indium-tin oxide, ITO). The spinning conditions and concentration of the polymer solution are so selected that a layer thickness of 500 nm results. After tempering at +80° C., a photoconductive polyvinylcarbazol layer (3000 nm) is spun on to the active polymer layer, and a thin Au electrode (30 nm) is sputtered on to this. The structure information is introduced by electron irradiation with acceleration voltages between 5 and 10 kV. The information is deleted with UV irradiation and temperature treatment at above 140° C.

6. A thin layer of a VF$_2$/F$_3$E copolymer (60% proportion of vinylidene fluoride) with a thickness of 100 nm is applied to an n- or p-doped silicon substrate. There then follows an aluminium layer 20 nm thick, with subsequent application of a polycarbonate layer 1000 nm thick. Information storage by electron beam is effected as in Example 1. Readout of the structure information is effected with an electron beam. As an additional variant, metallic layers may also be evaporated on to the silicon substrate.

7. Manufacture of the multilayers is effected by proceeding from the basis of a p-doped silicon, which is covered by a thin layer (c. 40 nm) of SiO$_2$. thereafter a VF$_2$/F$_3$E copolymer solution of methylethylketone is processed into a layer approximately 100 nm thick in a spin-coating process at 6000 min$^{-1}$. This is followed by a tempering process at 180° C. With the aid of magnetron sputtering, a cover layer 80 nm thick of SiO$_2$ is applied, and a thin layer of aluminium forms the conclusion to the layer build-up. Storage of the information by electron beams is undertaken under similar circumstances to those indicated in Example 1.

8. As further multilayers according to Examples 1 to 7, further electrically semiconductive layers (such for example as doped germanium, indium oxide), electrically conductive layers (for example various SiO$_2$ polymers), and metals with information storage layers on a basis of a VF$_2$/F$_3$E are combined, and the structure information inscribed with electron beams.

9. Supplementing Examples 1 to 8, a layer build-up is selected in which a thin polystyrol layer (500 nm thick) is applied to a quartz glass substrate, and there follows thereafter, as an active information storage layer, the corresponding fluoric copolymer or a polymethylmethacrylate side chain polymer with an azo dyestuff as side chain. The layer sequence is completed by an aluminium layer with a thickness of 20 nm.

The charge density introduced during information storage comes to 0.5 μc/cm$^2$.

We claim:

1. Information storage unit comprising a substrate with applied thereon a polymer layer (active polymer layer) which is polarisable by a focussed electron beam, characterized in that the active polymer layer is a component of a multi-layer, said multi-layer comprising an active polymer layer, at least one to a maximum of fifteen electrically-insulating layers, and at least one to a maximum of fifteen electrically conductive or semiconductive layers in an optional layer sequence, on condition that the active layer is disposed between at least one electrically-insulating layer and at least one conductive or semiconductive layer.

2. Information storage unit according to claim 1, characterised in that at least one conductive or one conductive and semiconductive layer is provided on the substrate side.

3. Information storage unit according to claims 1 or 2 characterized in that the active polymer layer is a hyperpolarisable polymer containing side groups, the "backbone" polymer being selected from the polyacrylate, polyester, polyimide, polysiloxane, polyethylene, polyvinyl ether, polystyrene, polyvinyl alcohol and polycarbonate group, and the side group contains nitro, cyano, amino or methyl groups.

4. Information storage unit according to claim 3, characterised in that the side group is selected from nitrostilbenes, azobenzenes, thiophenes, cyanobiphenylene, cyanophenylbenzoates, anilines, nitroanilines, aminonitrostilbenes, or dicyanovinylazo dyestuffs.

5. Information storage unit according to claims 1 or 2 characterized in that the electrically conductive layer is a metallic layer, particularly gold, aluminum, silver platinum, titanium or copper.

6. Information storage unit according to claim 1, characterized in that the substrate is selected from glass or metal.

* * * * *